(12) United States Patent
Isaac et al.

(10) Patent No.: US 7,606,332 B2
(45) Date of Patent: Oct. 20, 2009

(54) VARIABLE SIGNAL DELAYING CIRCUIT, QUADRATURE FREQUENCY CONVERTER AND RADIO FREQUENCY TUNER

(75) Inventors: Ali Isaac, Bristol (GB); Nicholas Paul Cowley, Wroughton (GB); David Albert Sawyer, Swindon (GB)

(73) Assignee: Intel Corporation, Santa Clara, CA (US)

( * ) Notice: Subject to any disclaimer, the term of this patent is extended or adjusted under 35 U.S.C. 154(b) by 616 days.

(21) Appl. No.: 11/423,015

(22) Filed: Jun. 8, 2006

(65) Prior Publication Data

US 2006/0280264 A1   Dec. 14, 2006

(30) Foreign Application Priority Data

Jun. 8, 2005   (GB)   ................................. 0511586.0

(51) Int. Cl.
   *H04L 27/22* (2006.01)
   *H04L 27/14* (2006.01)
(52) U.S. Cl. ...................... 375/332; 455/260; 455/323; 455/180.3
(58) Field of Classification Search ................ 375/156, 375/158, 161; 455/323, 67.14, 67.13, 76, 455/77, 260, 189.1, 180.3; 327/156, 158, 327/161; 324/76.53, 76.52, 76.54
   See application file for complete search history.

(56) References Cited

U.S. PATENT DOCUMENTS

| | | | |
|---|---|---|---|
| 6,518,807 B1 | 2/2003 | Cho | |
| 6,519,305 B1 * | 2/2003 | Roth et al. | 375/376 |
| 7,245,117 B1 * | 7/2007 | Joy et al. | 324/76.53 |
| 7,327,179 B2 * | 2/2008 | Sawyer et al. | 327/291 |
| 2002/0024366 A1 * | 2/2002 | Ooishi et al. | 327/156 |
| 2002/0065057 A1 * | 5/2002 | Kasperkovitz | 455/205 |
| 2005/0127964 A1 * | 6/2005 | Lee | 327/158 |
| 2005/0285643 A1 * | 12/2005 | Lee | 327/158 |
| 2006/0281432 A1 * | 12/2006 | Isaac et al. | 455/323 |

FOREIGN PATENT DOCUMENTS

| | | |
|---|---|---|
| JP | 4025245 | 1/1992 |
| JP | 6097755 | 4/1994 |

* cited by examiner

*Primary Examiner*—Chieh M Fan
*Assistant Examiner*—Aristocratis Fotakis
(74) *Attorney, Agent, or Firm*—Blakely, Sokoloff, Taylor & Zafman LLP

(57) ABSTRACT

A variable signal delaying circuit comprising an analog delay line having a control input for controlling the variable delay. A phase detector compares the input and output signals of the delaying circuit and supplies an output signal to a charge pump and integrator. A pulse stream generating arrangement produces pulse streams of different pulse widths and pulse control logic controls a selector for selecting any one of the pulse streams. In a first mode of operation, the control logic monitors the charge pump/filter output and selects the pulse stream which minimizes change in the output. The selection is fixed and the output of the charge pump/filter is then supplied as a correction signal to the control input of the analog delay line. Such an arrangement may be used to maintain minimum phase imbalance in I and Q signal paths of a quadrature frequency converter.

16 Claims, 4 Drawing Sheets

VARIABLE SIGNAL DELAYING CIRCUIT, QUADRATURE FREQUENCY CONVERTER AND RADIO FREQUENCY TUNER

FIELD OF THE INVENTION

The present invention relates to a variable signal delaying circuit for providing a variable delay between an input signal and an output signal. The present invention also relates to a quadrature frequency converter including such a circuit and to a radio frequency tuner including such a converter. Such a tuner may be used, for example, for receiving television signals, digital audio signals or digital data signals from a broadcast distribution arrangement, such as a terrestrial aerial, a satellite aerial system or a cable distribution network.

SUMMARY OF THE INVENTION

According to a first aspect of the invention, there is provided a variable signal delaying circuit for providing a variable delay between an input signal and an output signal, comprising an analog delay line having a control input for controlling the variable delay, a detector for comparing the input and output signals to provide an output signal representing the actual delay provided by the delay line, a digital pulse generator for generating a plurality of digital signals representing a plurality of different delay line delays, at least one comparator for forming error signals representing differences between the output signal of the detector and the digital signals of the pulse generator, and a controller having a first mode of operation, in which the controller supplies a delay command signal to the control input of the delay line, monitors the error signals and selects the one of the digital signals which corresponds to the smallest of the error signals, and a second mode of operation, in which the controller supplies the error signal corresponding to the selected digital signal as a delay correction signal to the control input of the delay line.

The detector may be arranged to provide a signal whose mark:ratio represents the actual delay.

The detector may be a phase detector.

The pulse generator may be arranged to generate the digital signals having the same frequency and different mark:ratios representing the different delays.

The pulse generator may comprise a generating circuit for simultaneously generating the digital signals representing the different delays and a selector for selecting any one of the digital signals.

The at least one comparator may comprise a charge pump and an integrator. The integrator may be arranged to be periodically reset. The integrator may be arranged to be reset for each cycle of the input signal.

According to a second aspect of the invention, there is provided a quadrature frequency converter comprising in-phase (I) and quadrature (Q) signal paths, at least one of which includes a circuit according to the first aspect of the invention.

The at least one signal path may include at least one selectable discrete delay circuit. The variable signal delaying circuit may have a maximum delay substantially equal to or greater than the delay of the at least discrete delay circuit.

The I and Q signal paths may be disposed between a quadrature oscillator and I and Q mixers, respectively. The quadrature oscillator and the I and Q mixers may comprise an upconverter. The upconverter may be preceded by a downconverter.

The converter may comprise a circuit for forming a linear combination of the output signals of the I and Q mixers.

According to a third aspect of the invention, there is provided a radio frequency tuner comprising a converter according to the second aspect of the invention.

It is thus possible to provide a variable signal delaying circuit which provides a stable delay to an input signal, for example following setting of the required delay during a calibration or alignment process. Such a circuit may be used in a frequency converter of a radio frequency tuner to allow a phase imbalance to be reduced or eliminated during the alignment phase by performing a phase adjustment, which then remains stable during normal reception operation of the tuner.

BRIEF DESCRIPTIONS OF THE DRAWINGS

The invention will be further described, by way of example, with reference to the accompanying drawings, in which.

DETAILED DESCRIPTIONS OF THE DRAWINGS

Figure 1:
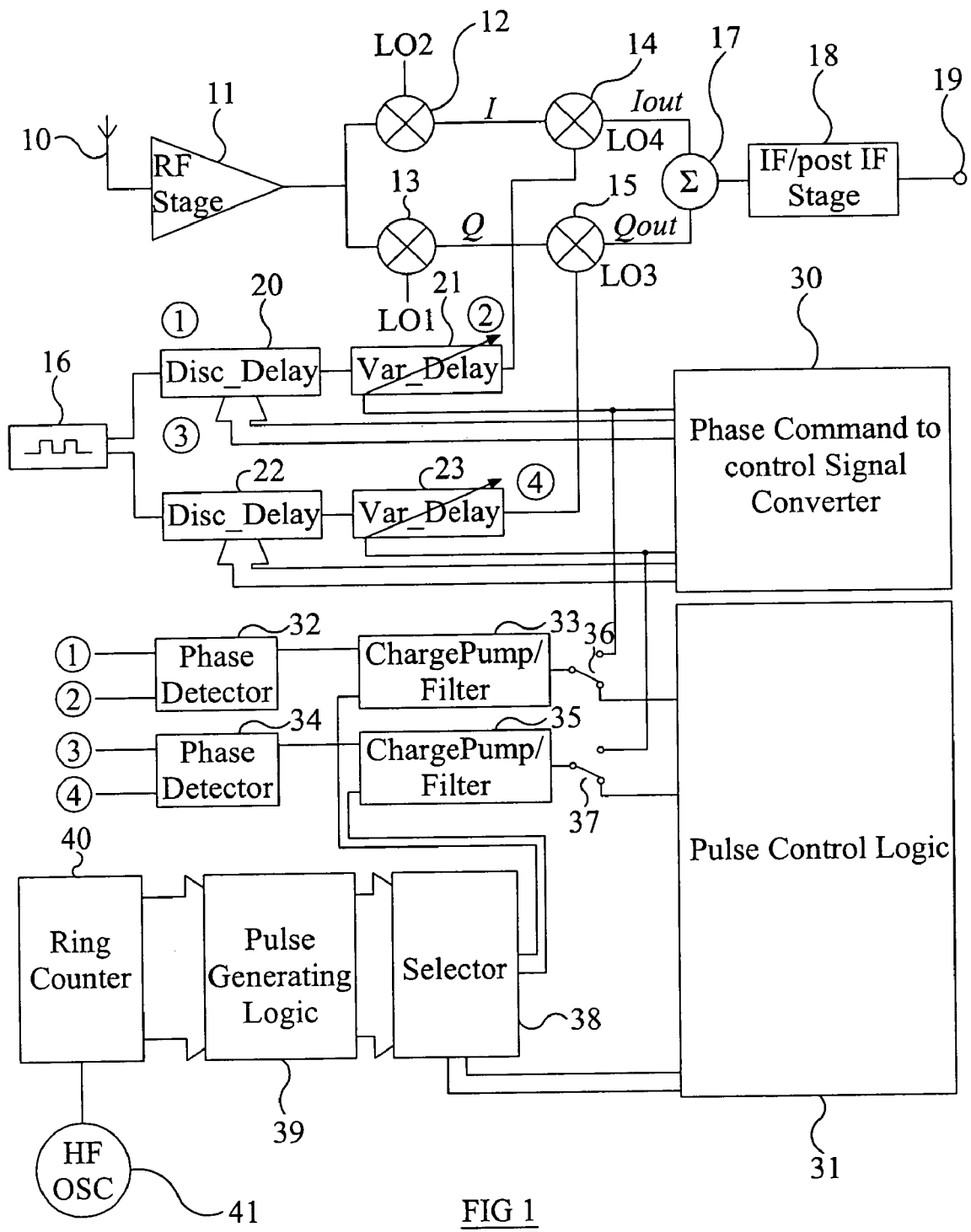
FIG. 1 is a block circuit diagram of a radio frequency tuner constituting an embodiment of the invention.

The tuner shown in FIG. 1 comprises an input 110, for example for connection to a terrestrial aerial, a satellite aerial system or a cable distribution network for receiving television, digital audio or digital data signals. The input 110 is connected to the input of a radio frequency (RF) stage 111, whose output is connected to a quadrature frequency converter described below. The structure and function of the RF stage 111 depend, for example, on the tuner architecture. For example, the RF stage 111 may provide automatic gain control and/or filtering functions.

The quadrature frequency converter comprises a quadrature downconverter followed by a quadrature upconverter. The quadrature downconverter comprises an in-phase (I) mixer 112 and a quadrature (Q) mixer 113, which receive commutating signals LO2 and LO1, which are substantially in phase-quadrature with respect to each other, from a quadrature local oscillator (not shown). The I and Q outputs of the mixers 112 and 113 are supplied to the inputs of mixers 114 and 115, respectively, which form part of the upconverter and which receive commutating signals LO4 and LO3 from a quadrature local oscillator 116 via phase adjusting circuits which are described hereinafter. The outputs of the mixers 114 and 115 are supplied to a circuit 117, which is illustrated as comprising a summer for forming the sum of the mixer output signals but which may alternatively comprise a subtractor for forming the difference between the mixer output signals or a circuit for forming a different linear combination of the mixer output signals. The output of the summer 117 is supplied to an intermediate frequency (IF) and/or post IF stage 118, whose structure and function depend, for example, on the architecture of the tuner. The output of the stage 118 is connected to an output 119 of the tuner which may, for example, be connected to a demodulator (not shown).

The quadrature outputs of the local oscillator 116 are supplied to the commutating signal inputs of the mixers 114 and 115 via I and Q signal paths. The I signal path comprises a discrete delay circuit 120 and a variable delay circuit 121 and the Q signal path comprises a discrete delay circuit 122 and a variable delay circuit 123. The delay circuits 120 to 123 provide phase adjustment for reducing or eliminating phase imbalance in the quadrature frequency converter and are shown in more detail in FIG. 2.

Figure 2:
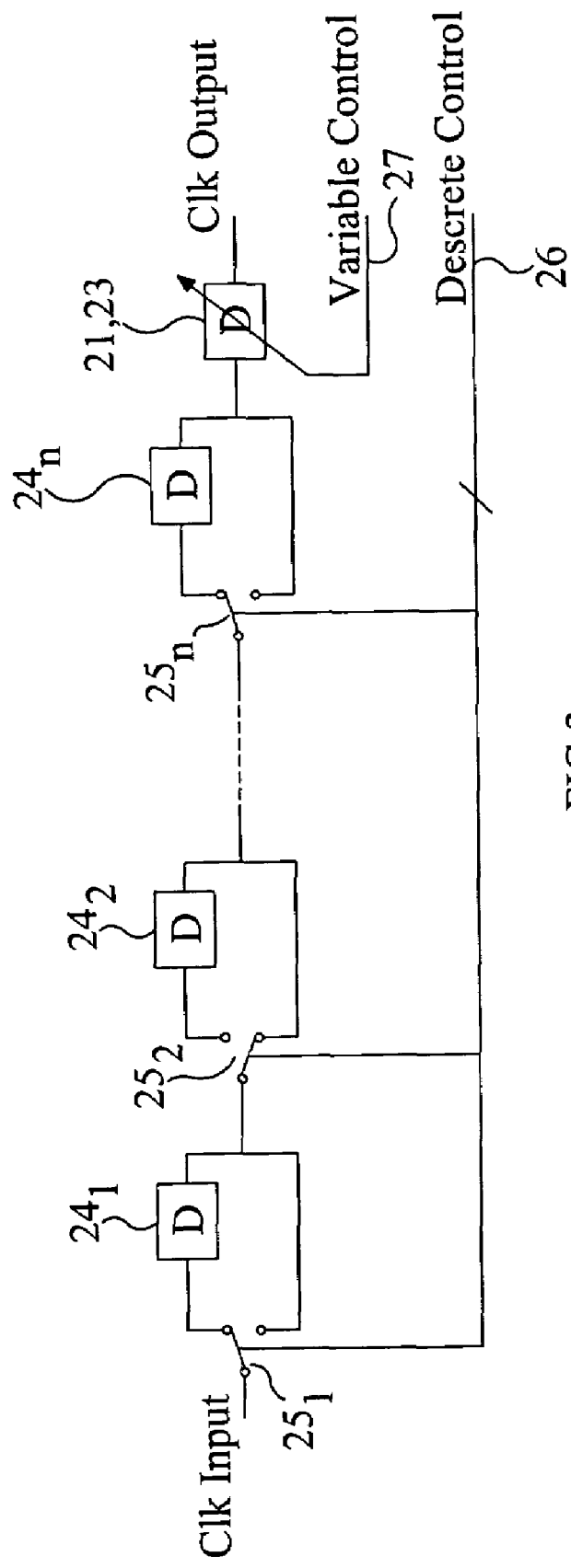
FIG. 2 is a block circuit diagram of part of the tuner of FIG. 1.

Each of the discrete delay circuits 120 and 122 comprises a plurality of fixed delay circuits $224_1, \ldots, 224_n$ which are arranged to provide the same fixed delay to the I or Q local oscillator signal supplied to a clock input. The delay circuits may provide equal or different delays of fixed and stable value and the total delay provided by the discrete delay circuit is selected by switching the individual delay circuits in or out of circuit by means of electronic switches $225_1, \ldots 225_n$ in accordance with a discrete control signal supplied to an input 226. The variable delay circuit 121 or 123 is connected in series or "cascade" with the chain of switches and delay circuits and is shown in FIG. 2 as being connected at the end of this chain but may be connected at any point within the chain. The variable delay circuit comprises an analog delay line having a control input for varying the delay in accordance with a variable control signal supplied to an input 227. The output of the variable delay circuit 121, 123 forms the clock output connected to the respective one of the mixers 114 and 115.

The variable delay circuit 121, 123 provides a delay which can be adjusted continuously or in relatively small steps from a value substantially equal to or close to zero to a value substantially equal to or slightly greater than the delay provided by each of the fixed delay circuits or the shortest delay provided by the fixed delay circuits. By controlling the delays provided in the I and Q signal paths between the quadrature local oscillator 116 and the mixers 114 and 115, it is possible to adjust the phases of and the relative phases between the commutating signals used in the upconversion of the quadrature frequency converter so as to permit compensation for phase imbalances to be provided.

Figure 3:
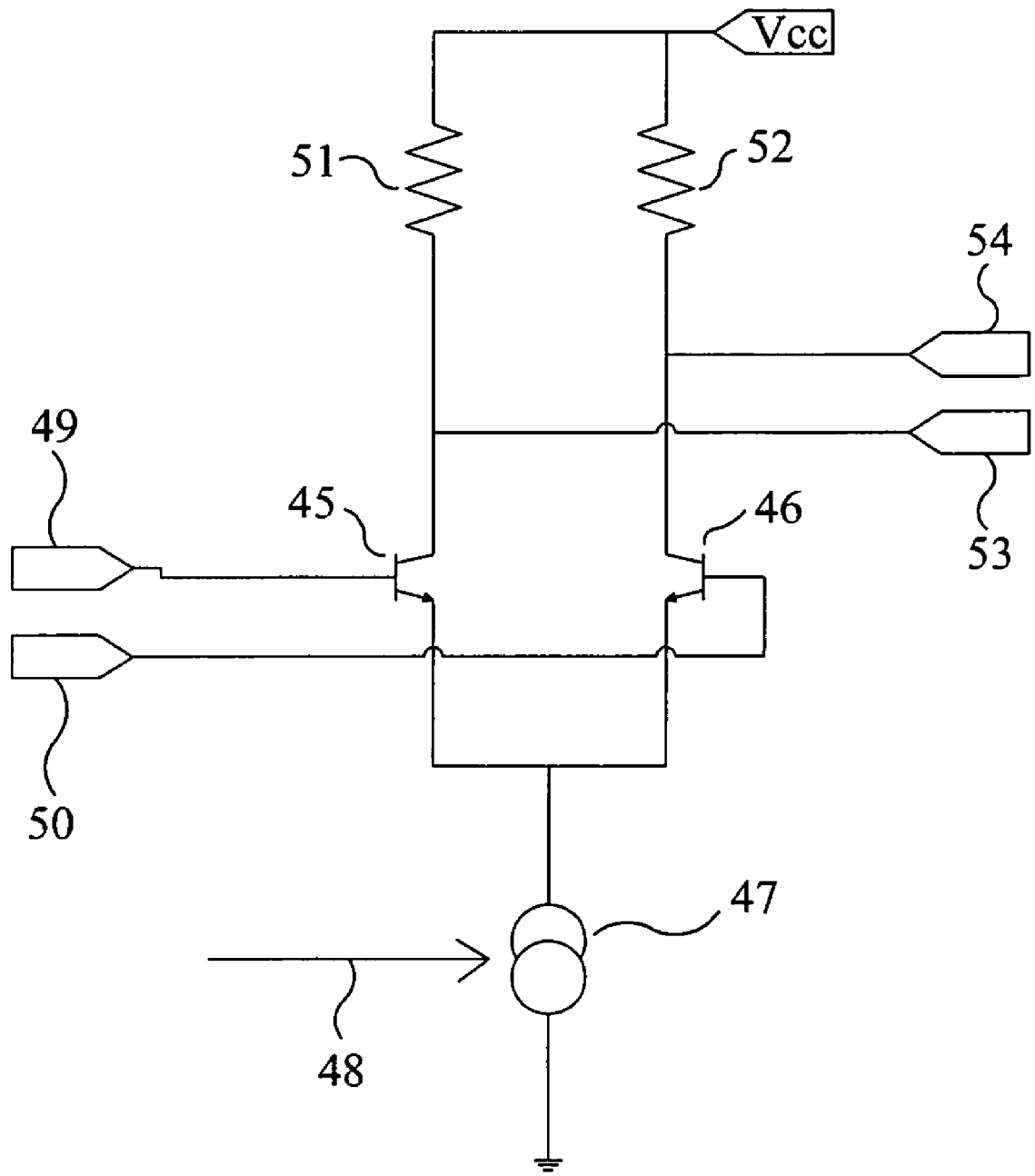
FIG. 3 is a circuit diagram of a delay element of the tuner of FIG. 1.

An example of a circuit suitable for use in the variable delay circuits 121 and 123 is illustrated in FIG. 3. In particular, each of the variable delay circuits 121, 123 may comprise one delay element as shown in FIG. 3 or a plurality of cascade-connected delay elements as shown in FIG. 3, according to the variable delay range required.

The delay element shown in FIG. 3 is in the form of a differential transconductance stage comprising a long-tail pair of transistors 345 and 346, whose emitters are connected together and to a controllable current source 347 having a control input 348 for controlling the current through the source 347. The transistors 345 and 346 are shown as bipolar NPN transistors but may alternatively comprise bipolar PNP transistors or field effect transistors of either polarity.

The delay element has differential inputs 349 and 350 connected to the bases of the transistors 345 and 346, respectively. The transistors 345 and 346 are provided with collector load resistors 351 and 352, respectively, whose upper ends are connected to a voltage supply line Vcc. The collectors of the transistors 345 and 346 are connected to differential outputs 353 and 354, respectively.

The delay element of FIG. 3 makes use of the transition delay which is fundamental to the operation of semiconductor devices. The magnitude of the delay provided by the delay element is inversely proportional to the parameter $f_T$ of the devices 345 and 346, where $f_T$ is the frequency at which the gain of the device has fallen to unity as frequency increases. The parameter $f_T$ is a fundamental property of the semiconductor process in which the delay element is implemented but is also dependent on the bias current. The bias current is determined by the control signal supplied to the control input 48 and controlling the current supplied by the current source 347, so that the delay provided by the delay element of FIG. 3 may be varied continuously.

In use, the control signal for controlling the delay provided by each of the variable delay circuits 121, 123 is supplied to the control input 348 of a single delay element or to all of the control inputs in parallel if the delay circuit comprises a plurality of cascade-connected delay elements. The or each delay element slows down the rising and falling edges of signals or pulses passing through it by an amount which is dependent on the current provided by the current source 347 such that lower currents provide slower rising and falling edges. If necessary, one or more Schmitt triggers may be provided, for example at the output of the variable delay circuit and possibly at the output of one or more intermediate delay elements. The signal supplied to each of the delay circuits 121, 123 may thus be delayed by a continuously variable amount.

The discrete and variable control signals are supplied by part 130 of a controller for converting phase command values to control signals for the delay circuits 120 to 123. The other part of the controller comprises pulse control logic 131 whose operation will be described hereinafter.

The input 1 and the output 2 of the phase adjusting circuit 120, 121 are supplied to the inputs of a phase detector 132 whose output is connected to a first input of a charge pump and integrator or filter 133. Similarly, the input 3 and the output 4 of the phase adjusting circuit 122, 123 are connected to the inputs of a phase detector 134, whose output is connected to the first input of a charge pump/integrator or filter 135. The outputs of the stages 133 and 135 are connected to the inputs of electronic changeover switches 136 and 137, respectively, which have first outputs connected to the pulse control logic 131 and second outputs connected to the control inputs of the variable delay circuits 121 and 123, respectively.

The stages 133 and 135 have second inputs connected to outputs of a selector 138 controlled by the pulse control logic 131. The selector has inputs connected to outputs of pulse generating logic 139, which has inputs connected to outputs of a ring counter 140. The ring counter 140 has a clock input connected to the output of a high frequency (HF) oscillator 141.

During operation of the tuner, an alignment procedure is carried out periodically in order to reduce or eliminate phase and gain imbalances between the I and Q signal paths through the mixers 112 and 114 in the I path and through the mixers 113 and 115 in the Q path. For example, such an alignment procedure may be performed each time the tuner is switched on or "powered up" and may additionally be performed each time a user requests the selection of a different channel for reception. In order to remove phase imbalances, a test tone is injected into the tuner before the quadrature frequency converter and a measure of phase imbalance is used to control adjustment of the delay circuits 120 to 123 so as to minimize the phase imbalance. Any suitable technique for achieving phase imbalance reduction or elimination may be used and a suitable example is disclosed in British patent application no. 0511582.9. This phase imbalance reduction is performed by a closed loop system which, while it operates, adjusts the delays provided by the circuits 120 to 123 so as to maintain minimum phase imbalance. However, because this alignment procedure relies on the use of a test tone in place of a received channel from the input 10, the phase imbalance minimizing control loop cannot operate during normal reception when the test tone is removed and a channel is selected for reception. Thus, when a phase imbalance minimum has been achieved, the following control technique is used in order to prevent drift in the delays provided by the variable delay circuits 121 and 123.

The phase command signals for the desired phase adjustments are converted in the controller 130 into control signals which are supplied to the delay circuits 120 to 123 in order to select the correct time delays which are equivalent to the required phase adjustments. The discrete delay circuits 120 and 122 are digital and the delays which they provide are not substantially subject to drift. However, the analog delay lines in the variable delay circuits 121 and 123 provide variable delays which may drift with time.

Figure 4:
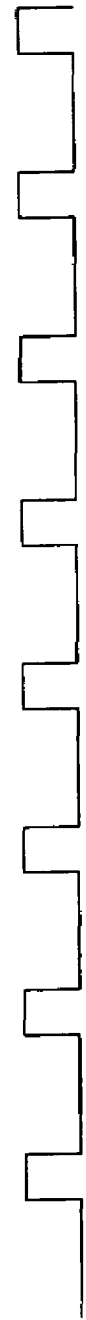
FIG. 4 illustrates a pulse series produced by a phase detector of the tuner of FIG. 1.

The input 1 and the output 2 of the phase adjusting circuit comprising the delay circuits 20 and 21 are connected to the inputs of the phase detector 132, which compares the phases of the signal from the quadrature local oscillator 116 and the signal supplied to the mixer 114. The phase detector 132 produces an output stream of pulses of the type illustrated in FIG. 4 with each pulse being synchronized with a respective pulse from the oscillator 116 and having a pulse width, equivalent to the mark:ratio of the pulse stream, which represents the difference in phase between the input signals to the detector 132. This pulse stream is supplied to the "charge" input of the charge pump and integrator or filter 133.

During the initial "synchronization" phase, the switches 136 and 137 are controlled by the pulse control logic 131 to supply the outputs of the circuits 133 and 135 to the control logic 131. The oscillator 141 produces a pulse stream as illustrated in the top waveform diagram in FIG. 5 comprising pulses of period T and width T/2, which is a sub-multiple of the period of the oscillator 116. The pulses are supplied to the ring counter 140, which is arranged to be reloaded once for every clock period of the oscillator 116. The "clock outputs" are illustrated by the upper waveform diagrams in FIG. 4.

Figure 5:
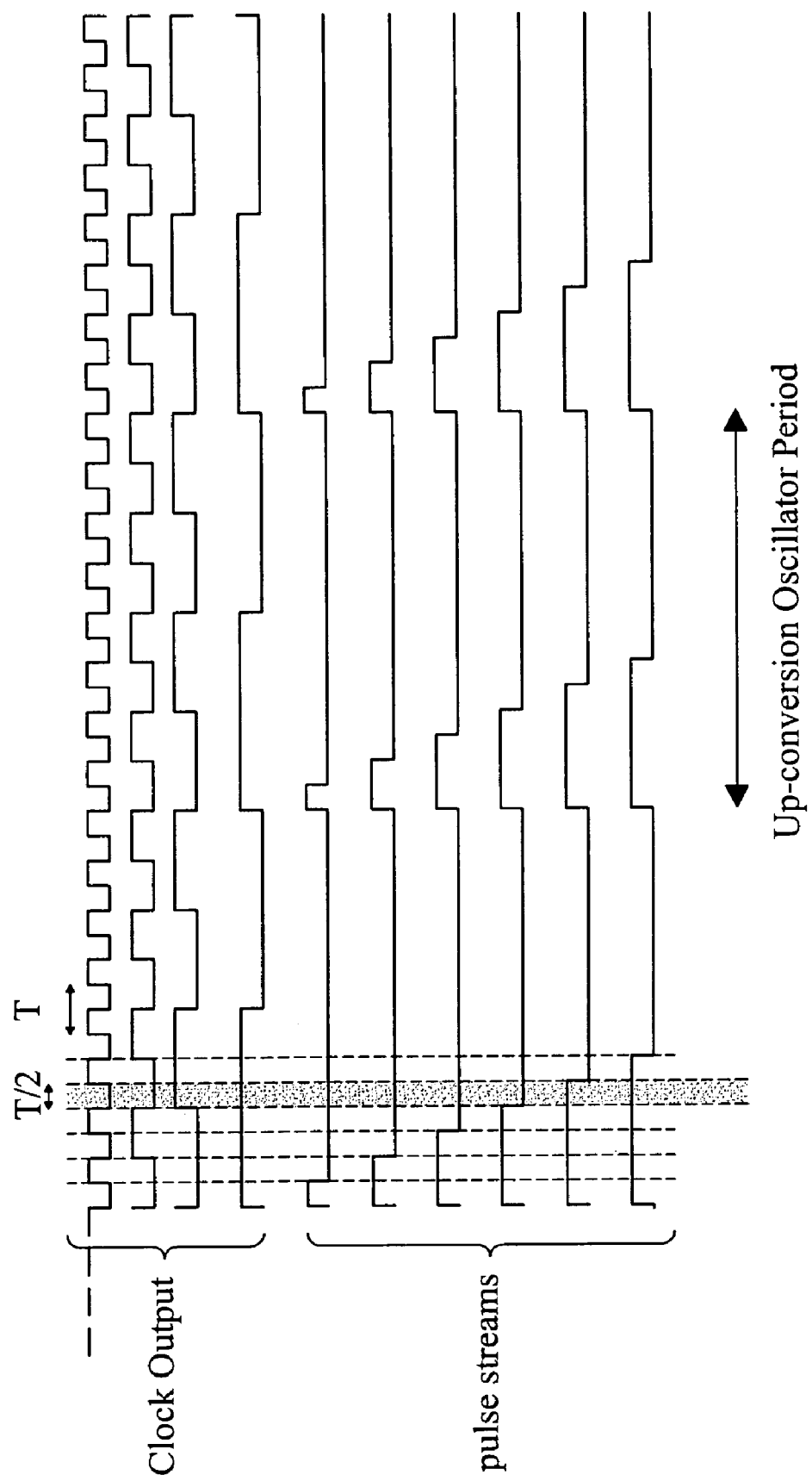
FIG. 5 illustrates waveforms which occur in a pulse generator of the tuner of FIG. 1.

The clock outputs are supplied to the pulse generating logic 139, which generates a plurality of "pulse streams", some of which are shown in the lower waveform diagrams in FIG. 5. The pulse streams have different mark:ratios such that the widths of the pulses of the stream increase in units of T/2. Thus, the uppermost pulse stream in FIG. 5 supplies pulses of width T/2, the next waveform comprises pulses of width T, the next waveform comprises pulses of width 3T/2, and so on to the final stream, which has a space width of T/2. The pulse control logic 131 selects these pulse streams in turn by means of the selector 138, which supplies the selected pulse stream to the "discharge" input of the charge pump and filter 133. A similar but independent selection is made for the charge pump and filter 137.

The pulse control logic 131 causes the selector 138 to step through the pulse streams while monitoring the output of the charge pump and filter 133. The control logic 131 periodically resets the charge pump and then monitors the output, which represents the difference in mark:ratio between the output pulse stream of the phase detector 132 and the pulse stream currently selected by the selector 138. The control logic 131 steps through the pulse streams until the output of the charge pump and filter 133 does not change or does not change substantially during its cycle of operation. The selected pulse stream thus has substantially the same mark:ratio as the output of the phase detector 132.

When this condition has been achieved, the mark:ratio of the selected pulse stream supplied to the charge pump and filter 133 is equal to that of the output pulse stream from the phase detector 132 when the delay circuits 120 and 121 are providing the correct phase adjustment as determined in the alignment procedure described hereinbefore. The period of the clock signal supplied by the oscillator 141 may easily be made very stable and drift-free during operation of the tuner so that the mark:ratio of the selected pulse stream will remain substantially fixed and drift-free during operation. The pulse control logic 131 then causes the switch 136 to connect the output of the charge pump and filter 133 to the control input of the variable delay circuit 121 so that the output signal of the charge pump and filter acts as a correction signal, for example by being summed with the control signal corresponding to the phase demand and provided by the converter 130. Thus, during subsequent operation of the tuner, any drift in the actual delay provided by the delay circuit 121 and, indeed, by the delay circuit 120 is removed by a closed circuit control loop. In particular, if the delay provided by the variable delay circuit 121 drifts, the phase difference between the signals supplied to the phase detector 132 changes so that the mark:ratio of its output pulse stream changes. This results in the output of the charge pump and filter 133 supplying an error or correction signal, which is fed back to the control input of the variable delay circuit 121 so as to adjust the variable delay to remove the error.

It is thus possible to provide a technique which is capable of maintaining phase adjustments so as to maintain minimum phase imbalance in a quadrature frequency converter. The use of an analog delay line is necessary because digital equivalents cannot operate at a sufficiently high frequency to be capable of use in this application. The present arrangement provides a technique for substantially eliminating drift in such an analog delay line so that the stability of the phase adjustment is equivalent to a digital solution.

Various modifications may be made within the scope of the invention (as defined in the appended claims). For example, each of the pulse streams generated by the pulse generating logic 139 may be supplied to its own respective pair of first and second charge pumps and filters, with the first and second charge pumps having inputs connected to the phase detectors 132 and 134, respectively. The outputs of the first and second charge pumps are then supplied to first and second (analog) selectors, which are controlled by the control logic 131 and whose outputs are connected to the control inputs of the delay circuits 121 and 123, respectively. Thus, for each variable delay circuit 121 and 123, the control logic 131 selects the one of the charge pumps and filters whose output changes least during each cycle of operation.

Also, although the phase adjustment is provided in each of the I and Q paths between the oscillator 116 and the mixers 114 and 115 in the embodiments shown in FIG. 1, phase adjustment may be provided in only one of the I and Q paths in other embodiments. For example, a variable delay may be provided in one of the paths covering a phase adjustment range of at least 360° and the other path may be provided with a fixed delay, for example equivalent to a 180° phase delay, or with no delay at all. Such arrangements permit the use of a single control loop for maintaining stable the single variable delay.

The invention claimed is:

1. A variable signal delaying circuit for providing a variable delay between an input signal and an output signal, said delaying circuit comprising:
    an analog delay line having a control input for controlling said variable delay;
    a detector for comparing said input and output signals to provide an output signal representing an actual delay provided by said delay line;
    a digital pulse generator for generating a plurality of digital signals representing a plurality of different delay line delays;

at least one comparator for forming error signals representing differences between said output signal of said detector and said digital signals of said pulse generator; and a controller having a first mode of operation, wherein said controller supplies a delay command signal to said control input of said delay line, monitors said error signals and selects one of said digital signals which corresponds to a smallest of said error signals; and a second mode of operation, wherein said controller supplies said error signal corresponding to said selected digital signal as a delay correction signal to said control input of said delay line.

2. The circuit as claimed in claim 1, wherein said detector is arranged to provide said output signal with a mark:space ratio which represents said actual delay.

3. The circuit as claimed in claim 1, wherein said detector is a phase detector.

4. The circuit as claimed in claim 1, wherein said pulse generator is arranged to generate said digital signals having a same frequency and different mark:space ratios representing said different delays.

5. The circuit as claimed in claim 1, wherein said pulse generator comprises a generating circuit for simultaneously generating said digital signals representing said different delays and a selector for selecting any one of said digital signals.

6. The circuit as claimed in claim 1, wherein said comparator comprises a charge pump and an integrator.

7. The circuit as claimed in claim 6, wherein said integrator is arranged to be periodically reset.

8. The circuit as claimed in claim 7, wherein said integrator is arranged to be reset for each cycle of said input signal.

9. A quadrature frequency converter comprising:

in-phase (I) and quadrature (Q) signal paths wherein at least one of the signal paths includes a variable signal delaying circuit for providing a variable delay between an input signal and an output signal, said delaying circuit comprising:

an analog delay line having a control input for controlling said variable delay;

a detector for comparing said input and output signals to provide an output signal representing an actual delay provided by said delay line;

a digital pulse generator for generating a plurality of digital signals representing a plurality of different delay lines delays;

at least one comparator for forming error signals representing differences between said output signal of said detector and said digital signals of said pulse generator; and a controller having a first mode of operation, wherein said controller supplies a delay command signal to said control input of said delay line, monitors said error signals and selects one of said digital signals which corresponds to a smallest of said error signals, and a second mode of operation, wherein said controller supplies said error signal corresponding to said selected digital signal as a delay correction signal to said control input of said delay line.

10. The converter as claimed in claim 9, wherein said at least one signal path comprises at least one selectable discrete delay circuit.

11. The converter as claimed in claim 10, wherein said variable signal delaying circuit has a maximum delay substantially equal to or greater than a delay of said at least one discrete delay circuit.

12. The converter as claimed in claim 9, further comprising I and Q mixers and a quadrature oscillator and in which said I and Q signal paths are disposed between said quadrature oscillator and said I and Q mixers, respectively.

13. The converter as claimed in claim 12, wherein said quadrature oscillator and said I and Q mixers further comprise an upconverter.

14. The converter as claimed in claim 13, further comprising a downconverter preceding said upconverter.

15. The converter as claimed in claim 12, further comprising a circuit for forming a linear combination of output signals of said I and Q mixers.

16. A radio frequency tuner comprising:

a quadrature frequency converter having in-phase and quadrature signal paths, at least one of which comprises a variable signal delaying circuit for providing a variable delay between an input signal and an output signal, said delaying circuit comprising:

an analog delay line having a control input for controlling said variable delay;

a detector for comparing said input and output signals to provide an output signal representing an actual delay provided by said delay line;

a digital pulse generator for generating a plurality of digital signals representing a plurality of different delay line delays;

at least one comparator for forming error signals representing differences between said output signal of said detector and said digital signals of said pulse generator; and a controller having a first mode of operation, wherein said controller supplies a delay command signal to said control input of said delay line, monitors said error signals and selects one of said digital signals which corresponds to a smallest of said error signals, and a second mode of operation, wherein said controller supplies said error signal corresponding to said selected digital signal as a delay correction signal to said control input of said delay line.

* * * * *

UNITED STATES PATENT AND TRADEMARK OFFICE
CERTIFICATE OF CORRECTION

| | | |
|---|---|---|
| PATENT NO. | : 7,606,332 B2 | Page 1 of 1 |
| APPLICATION NO. | : 11/423015 | |
| DATED | : October 20, 2009 | |
| INVENTOR(S) | : Isaac et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 750 days.

Signed and Sealed this

Fifth Day of October, 2010

David J. Kappos
*Director of the United States Patent and Trademark Office*